（12） United States Patent
Uchida et al.

(10) Patent No.: US 11,353,514 B2
(45) Date of Patent: Jun. 7, 2022

(54) BATTERY SYSTEM AND SOC ESTIMATION METHOD FOR SECONDARY BATTERY

(71) Applicant: TOYOTA JIDOSHA KABUSHIKI KAISHA, Toyota (JP)

(72) Inventors: Yoshihiro Uchida, Nagakute (JP); Kiyohito Machida, Toyota (JP); Yuki Moriya, Okazaki (JP); Nobuyuki Tanaka, Toyota (JP); Kazuki Kubo, Toyota (JP); Masaki Uchiyama, Obu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 356 days.

(21) Appl. No.: 16/728,376

(22) Filed: Dec. 27, 2019

(65) Prior Publication Data

US 2020/0256922 A1 Aug. 13, 2020

(30) Foreign Application Priority Data

Feb. 12, 2019 (JP) .............................. JP2019-022416

(51) Int. Cl.
*H01M 10/42* (2006.01)
*G01R 31/382* (2019.01)
*H01M 10/48* (2006.01)

(52) U.S. Cl.
CPC ...... *G01R 31/382* (2019.01); *H01M 10/4285* (2013.01); *H01M 10/48* (2013.01); *H01M 2220/20* (2013.01)

(58) Field of Classification Search
CPC .............. G01R 31/374; G01R 31/382; G01R 31/3842; G01R 31/396; H01M 10/4285; H01M 10/44; H01M 10/48; H01M 2220/20; Y02E 60/10
See application file for complete search history.

(56) References Cited

U.S. PATENT DOCUMENTS

| | | |
|---|---|---|
| 2004/0178798 A1 | 9/2004 | Kikuchi et al. |
| 2008/0036421 A1 | 2/2008 | Seo et al. |
| 2014/0225621 A1 | 8/2014 | Kimura et al. |

FOREIGN PATENT DOCUMENTS

| | | | | |
|---|---|---|---|---|
| CN | 103842837 A | 6/2014 | | |
| JP | 2004-271434 A | 9/2004 | | |
| JP | 2015154639 A | * 8/2015 | ............... | H02J 7/00 |
| JP | 2018-151175 A | 9/2018 | | |

OTHER PUBLICATIONS

Machine Translation JP2015154639A (Year: 2015).*

* cited by examiner

*Primary Examiner* — Victoria H Lynch
(74) *Attorney, Agent, or Firm* — Sughrue Mion, PLLC (57) ABSTRACT

An ECU sets a SOC estimated from an OCV at the time of activating a system of a vehicle as an initial SOC value in the case where the SOC during a stop of the system is higher than a first SOC, which represents the SOC estimated from the OCV at the time of activating the system by using a discharging curve line, or the SOC during the stop of the system is lower than a second SOC, which represents the SOC estimated from the OCV at the time of activating the system by using a charging curve line. The ECU sets the SOC during the stop of the system as the initial SOC value in the case where the SOC during the stop of the system is equal to or lower than the first SOC and is equal to or higher than the second SOC.

4 Claims, 8 Drawing Sheets

| OCV | SOC1 | SOC2 |
|-----|------|------|
| V1  | S11  | S21  |
| V2  | S12  | S22  |
| V3  | S13  | S23  |
| ⋮   | ⋮    | ⋮    |
| Vn  | S1n  | S2n  |

| TEMPERATURE | POLARIZATION ELIMINATION TIME |
|---|---|
| T1 | t1 |
| T2 | t2 |
| T3 | t3 |
| ⋮ | ⋮ |
| Tn | tn |

BATTERY SYSTEM AND SOC ESTIMATION METHOD FOR SECONDARY BATTERY

INCORPORATION BY REFERENCE

The disclosure of Japanese Patent Application No. 2019-022416 filed on Feb. 12, 2019 including the specification, drawings and abstract is incorporated herein by reference in its entirety.

BACKGROUND

1. Technical Field

The present disclosure relates to a battery system including a secondary battery and a state of charge (SOC) estimation method for a secondary battery.

2. Description of Related Art

A remaining capacity estimation device for a secondary battery is disclosed in Japanese Patent Application Publication No. 2004-271434 (JP 2004-271434 A). In this estimation device, a battery voltage V2 is acquired when an ignition switch (IG-SW) is operated to be on, and a voltage difference ΔV between the battery voltage V2 and a battery voltage V1, which is stored when the IG-SW is operated to be off, is calculated. In the case where the voltage difference ΔV is smaller than a determination value ΔVC, a polarization voltage that is stored before a disuse period is set as a polarization voltage initial value. On the other hand, in the case where the voltage difference ΔV is equal to or larger than the determination value ΔVC, the polarization voltage initial value is set to 0. This polarization voltage initial value is used to calculate an open circuit voltage (OCV), and a SOC is calculated from the calculated OCV. In this way, it is possible to provide the inexpensive remaining capacity estimation device capable of estimating remaining capacity of the secondary battery in consideration of a transition of the polarization voltage (see JP 2004-271434 A).

SUMMARY

The high-accuracy estimation of the SOC of the secondary battery is important to sufficiently use and appropriately protect the secondary battery. As a method for estimating the SOC of the secondary battery, a method for estimating the SOC from the OCV by using a SOC-OCV curve of the secondary battery has widely been known.

There is a secondary battery whose discharging curve line, which represents the SOC-OCV curve of a case where the secondary battery is discharged, and charging curve line, which representing the SOC-OCV curve of a case where the secondary battery is charged, are prominently diverged from each other. A divergence between the discharging curve line and the charging curve line will hereinafter be referred to as that "hysteresis" exists on the SOC-OCV curve.

For example, it is considered to use a silicon-based material (Si, SiO, or the like) is used as a negative-electrode active material for a lithium-ion secondary battery. In the case where the silicon-based material is used as the negative-electrode active material, compared to a case where the silicon-based material is not used, full-charge capacity can be increased by increasing energy density. Meanwhile, in the case where the silicon-based material is used as the negative-electrode active material, compared to the case where the silicon-based material is not used, the hysteresis on the SOC-OCV curve is increased.

In the case where the hysteresis exists on the SOC-OCV curve, the SOCs acquired from the SOC-OCV curve by charging/discharging history so far differ even when the OCV is the same. Thus, the SOC estimation accuracy, which is based on the OCV, is possibly low. In JP 2004-271434 A, the hysteresis on the SOC-OCV curve as described above is not considered. Thus, there is room for improvement in the SOC estimation accuracy.

The present disclosure has been made to solve such a problem, and thus an object of the present disclosure is to improve SOC estimation accuracy of a secondary battery having hysteresis on a SOC-OCV curve.

A battery system according to an aspect of the present disclosure includes a secondary battery and a controller. The controller is configured to estimate a SOC from an OCV by using a discharging curve line (a discharging curve) and a charging curve line (a charging curve), the discharging curve line (the discharging curve) representing a SOC-OCV characteristic when the secondary battery is discharged, and the charging curve line (the charging curve) representing the SOC-OCV characteristic when the secondary battery is charged. The controller executes setting processing for setting an initial value of the SOC at next time of activating a system in a vehicle after a stop of the system. The setting processing includes first processing and second processing. In the first processing, the SOC estimated from the OCV at the time of activating the system is set as the initial value in the case where the SOC during the stop of the system is higher than a first SOC, which represents the SOC estimated from the OCV at the time of activating the system by using the discharging curve line, or the SOC during the stop of the system is lower than a second SOC, which represents the SOC estimated from the OCV at the time of activating the system by using the charging curve line. In the second processing, the SOC during the stop of the system is set as the initial value in the case where the SOC during the stop of the system is equal to or lower than the first SOC and is equal to or higher than the second SOC.

A SOC estimation method according to another aspect of the present disclosure is a SOC estimation method for a secondary battery in a battery system. The battery system includes the secondary battery and a controller. The controller is configured to estimate a SOC from an OCV by using a discharging curve line (a discharging curve) and a charging curve line (a charging curve), the discharging curve line (the discharging curve) representing a SOC-OCV characteristic when the secondary battery is discharged, and the charging curve line (the charging curve) representing the SOC-OCV characteristic when the secondary battery is charged. The SOC estimation method includes a step of setting an initial value of the SOC at next time of activating a system in a vehicle after a stop of the system. The step includes: a step of setting the SOC estimated from the OCV at the time of activating the system as the initial value in the case where the SOC during the stop of the system is higher than a first SOC, which represents the SOC estimated from the OCV at the time of activating the system by using the discharging curve line, or the SOC during the stop of the system is lower than a second SOC, which represents the SOC estimated from the OCV at the time of activating the system by using the charging curve line; and a step of setting the SOC during the stop of the system as the initial value in the case where the SOC during the stop of the system is equal to or lower than the first SOC and is equal to or higher than the second SOC.

In the battery system and the SOC estimation method for the secondary battery described above, in the case where the SOC during the stop of the system (a last SOC value) is equal to or lower than the first SOC and is equal to or higher than the second SOC, a change (a divergence) of the SOC from the last SOC value is possibly caused by an influence of hysteresis. Thus, in this case, as the initial SOC value at the time of activating the system, the last SOC value is set instead of the SOC estimated from the OCV at the time of activating the system (a current SOC value). On the other hand, in the case where the last SOC value is higher than the first SOC or where the last SOC value is lower than the second SOC, the change (the divergence) of the SOC from the last SOC value is not caused by the influence of the hysteresis. Thus, in this case, the current SOC value is set as the initial SOC value at the time of activating the system. Therefore, according to this battery system and this SOC estimation method, it is possible to improve SOC estimation accuracy of the secondary battery having the hysteresis on a SOC-OCV curve.

The controller may execute the setting processing in the case where polarization of the secondary battery is eliminated at the time of activating the system, and may set the SOC during the stop of the system (the last SOC value) as the initial value in the case where the polarization of the secondary battery is not eliminated at the time of activating the system.

In the case where the polarization is not eliminated at the time of activating the system, the change (the divergence) of the SOC from the last SOC value is possibly caused by an influence of the polarization. In the case where the polarization is not eliminated at the time of activating the system, reliability of the current SOC value is not high. Thus, the last SOC value is set as the initial SOC value at the time of activating the system. On the other hand, in the case where the polarization is eliminated at the time of activating the system, the above setting processing is executed. Therefore, according to this battery system, it is possible to improve the SOC estimation accuracy by eliminating the influence of the polarization.

Preferably, the controller may determine that the polarization is eliminated in the case where a time during the stop of the system passes a polarization elimination time indicating a time in which the polarization of the secondary battery is eliminated. Here, the polarization elimination time may be set to be extended as a temperature of the secondary battery is lowered.

With such a configuration, presence or absence of the elimination of the polarization is determined with a high degree of accuracy. Therefore, it is possible to improve the SOC estimation accuracy by eliminating the influence of the polarization.

According to the battery system and the SOC estimation method for the secondary battery according to the present disclosure, it is possible to improve the SOC estimation accuracy of the secondary battery having the hysteresis on the SOC-OCV curve.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

A detailed description will hereinafter be made on embodiments of the present disclosure with reference to the drawings. Note that the same or corresponding portions in the drawings will be denoted by the same reference numerals and symbols and the description thereon will not be repeated.

First Embodiment

Figure 1:
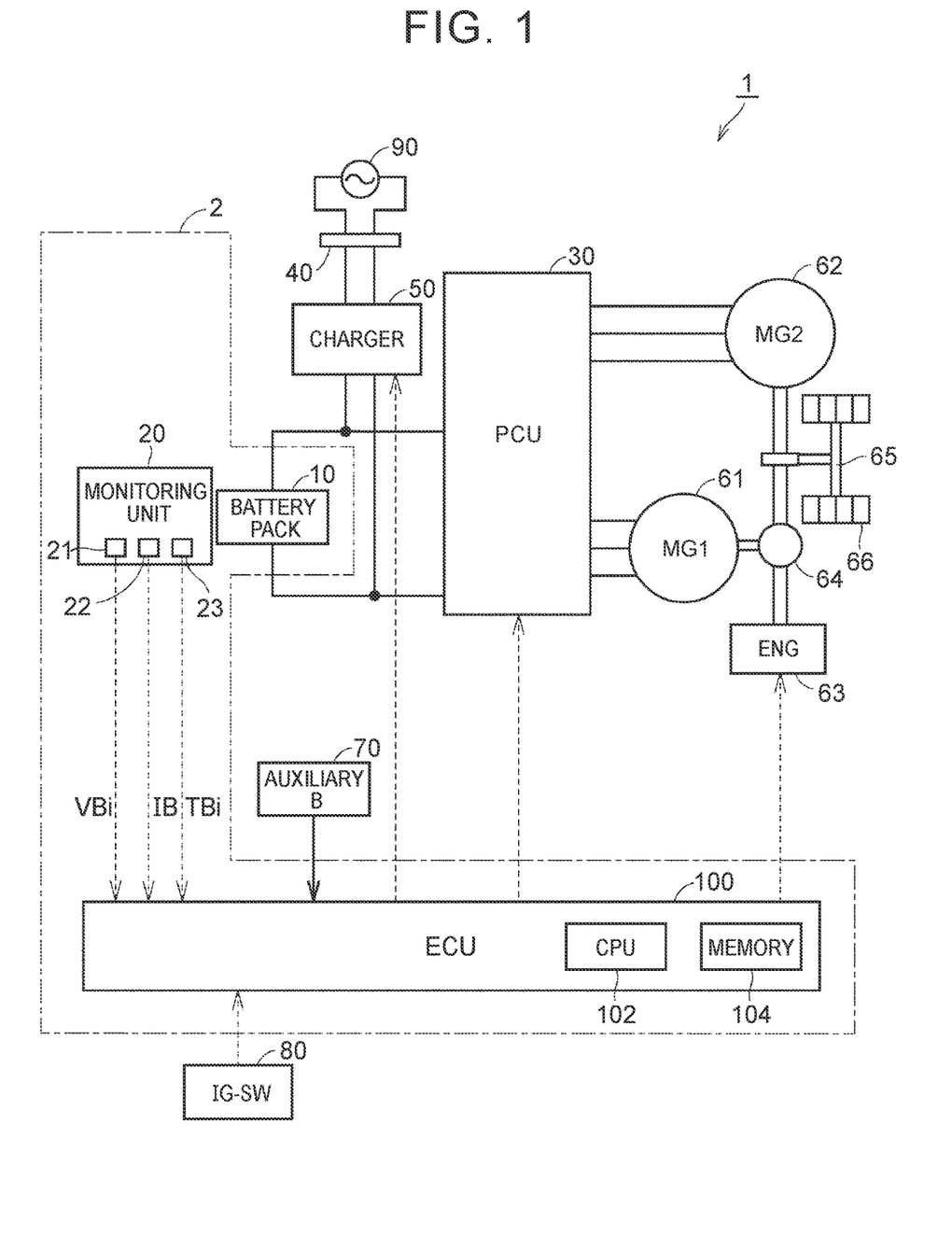
FIG. 1 is a diagram schematically illustrating a configuration of a vehicle on which a battery system according to a first embodiment of the present disclosure is mounted.

FIG. 1 is a diagram schematically illustrating a configuration of a vehicle 1 on which a battery system according to a first embodiment of the present disclosure is mounted. Hereinafter, a description will representatively be made on a case where the vehicle 1 is a hybrid vehicle. However, the battery system according to the present disclosure is not limited to a battery system mounted on the hybrid vehicle, but can also be applied to any type of the vehicle, on which a battery pack 10 described later is mounted, and an application other than the vehicle.

Referring to FIG. 1, the vehicle 1 includes a battery system 2, a power control unit (hereinafter referred to as "PCU") 30, an inlet 40, and a charger 50. The vehicle 1 further includes motor generators (hereinafter referred to as "MGs") 61, 62, an engine 63, a power split device 64, a driveshaft 65, drive wheels 66, an auxiliary battery 70, and an ignition switch (hereinafter referred to as "IG-SW") 80. The battery system 2 includes the battery pack 10, a monitoring unit 20, and an electronic control unit (hereinafter referred to as "ECU") 100.

Each of the MGs 61, 62 is an AC rotary electric machine and is, for example, a three-phase AC synchronous motor in which a permanent magnet is embedded in a rotor. The MG 61 is primarily used as a generator that is driven by the engine 63 through the power split device 64. Electricity generated by the MG 61 is supplied to the battery pack 10 or the MG 62 via the PCU 30.

The MG 62 is primarily operated as a motor and drives the drive wheels 66. The MG 62 receives at least one of the electricity from the battery pack 10 and the electricity generated by the MG 61, so as to generate a drive force. The drive force generated by the MG 62 is transmitted to the drive wheels 66 through the driveshaft 65. Meanwhile, during braking of the vehicle 1, the MG 62 is operated as a generator and generates regenerative power. The electricity generated by the MG 62 is supplied to the battery pack 10 through the PCU 30.

The engine 63 is an internal combustion engine that converts combustion energy generated by burning air-fuel mixture to kinetic energy of moving elements such as a piston and the rotor, so as to generate power. The power split device 64 includes a planetary gear mechanism that has three rotational shafts of a sun gear, a carrier, and a ring gear, for example. The power split device 64 splits the power output from the engine 63 into power used to drive the MG 61 and power used to drive the drive wheels 66.

The battery pack 10 is configured to include plural secondary batteries (cells). In this first embodiment, each of the cells is a lithium-ion secondary battery. An electrolyte of the lithium-ion secondary battery may be a liquid, a polymer, or a solid substance. The battery pack 10 stores the electricity used to drive the MGs 61, 62, and supplies the electricity to the MGs 61, 62 through the PCU 30. In addition, when the MGs 61, 62 generate the electricity, the battery pack 10 is charged by receiving the generated electricity through the PCU 30. An output voltage of the battery pack 10 is several hundred V, for example.

The monitoring unit 20 includes a voltage sensor 21, a current sensor 22, and a temperature sensor 23. The voltage sensor 21 detects a voltage VBi of each of the cells provided in the battery pack 10. The current sensor 22 detects a current IB into/out of the battery pack 10. Hereinafter, the current IB has a negative reference symbol during charging, and the current IB has a positive reference symbol during discharging. The temperature sensor 23 detects a temperature TBi of each of the cells. Each of the sensors outputs a detection result to the ECU 100.

The voltage sensor 21 may detect the voltage of the plural cells connected in series as a monitoring unit, for example. The temperature sensor 23 may detect the temperature of the plural adjacent cells as a monitoring unit. In this first embodiment, the monitoring unit of each of the sensors is not particularly limited.

In accordance with a control signal from the ECU 100, the PCU 30 executes bidirectional electricity conversion between the battery pack 10 and the MGs 61, 62. The PCU 30 is configured to be able to separately control states of the MGs 61, 62. For example, the PCU 30 can bring the MG 62 into a motoring state while bringing the MG 61 into a regenerative (generating) state. For example, the PCU 30 is configured to include: two inverters provided in a corresponding manner to the MGs 61, 62; and a capacitor that increases a DC voltage to be supplied to each of the inverters to be equal to or higher than an output voltage of the battery pack 10.

The inlet 40 is configured that a connector provided on at a tip of a charge cable from a power supply 90 provided on the outside of the vehicle 1 can be connected thereto. In a state where the connector of the charge cable is connected to the inlet 40, the inlet 40 is supplied with the electricity from the power supply 90 through the charge cable. The power supply 90 is a commercial power supply, for example.

In accordance with a control signal from the ECU 100, the charger 50 converts the electricity received from the inlet 40 to the electricity suited to charge the battery pack 10. The charger 50 is configured to include an inverter and a capacitor (neither of which is illustrated), for example.

The ECU 100 is configured to include a central processing unit (CPU) 102, memory (more specifically, read only memory (ROM) and random access memory (RAM)) 104, and input/output ports (not illustrated) used to input/output various signals. The CPU 102 loads a program stored in the ROM onto the RAM and executes the program. In the program stored in the ROM, processing that is executed by the ECU 100 is written.

As one of main processing executed by the ECU 100, the ECU 100 calculates a SOC per cell of the battery pack 10 on the basis of a signal received from each of the sensors in the monitoring unit 20 as well as a program and a map stored in the memory 104. Then, the ECU 100 adds the SOC calculated per cell so as to calculate the SOC of the entire battery pack 10. The ECU 100 controls charging/discharging of the battery pack 10 on the basis of the SOC of the entire battery pack 10.

In this first embodiment, the SOC per cell is calculated as follows. When a system of the vehicle 1 is activated, the ECU 100 estimates the SOC by using a SOC-OCV curve and sets an initial value of the SOC by using the estimated SOC. As will be described later, hysteresis exists on the SOC-OCV curve, and the initial SOC value is set in consideration of an influence of such hysteresis. A method for setting the initial SOC value in the battery system 2 according to this first embodiment will be described later in detail.

When setting the initial SOC value, the ECU 100 adds an integrated value of a charge/discharge current to the set initial SOC value, so as to estimate the SOC during the activation of the system. Here, the charge/discharge current per cell may be calculated by dividing a detection value of the current sensor 22 by the number of parallel cells in the battery pack 10, or may be calculated by using any of various known methods in consideration of variations in the temperature or resistance among the parallel cells, for example.

In the above description, the ECU 100 estimates the SOC, and the ECU 100 further controls the PCU 30, the charger 50, the engine 63, and the like. However, the ECU may be configured separately for each type of the processing. For example, SOC estimation processing, the control of the charger 50, the control of the PCU 30, and the control of the engine 63 may be implemented by a battery ECU, a charge ECU, a drive ECU, an engine ECU, and the like, respectively.

The auxiliary battery 70 supplies actuation electricity to various auxiliary machines that are mounted on the vehicle 1 and are not illustrated. The auxiliary battery 70 also supplies the actuation electricity to the ECU 100. The auxiliary battery 70 is a lead-acid battery, for example. However, a type thereof is not particularly limited. The auxiliary battery 70 may be another type of the secondary battery, an electric double-layered capacitor, or the like. An output voltage of the auxiliary battery 70 is lower than the output voltage of the battery pack 10 and is 12 V, for example.

The IG-SW 80 is a switch operable by a driver. The driver can activate the system of the vehicle 1 by turning the IG-SW 80 on, and can stop the system of the vehicle 1 by turning the IG-SW 80 off.

Figure 2:
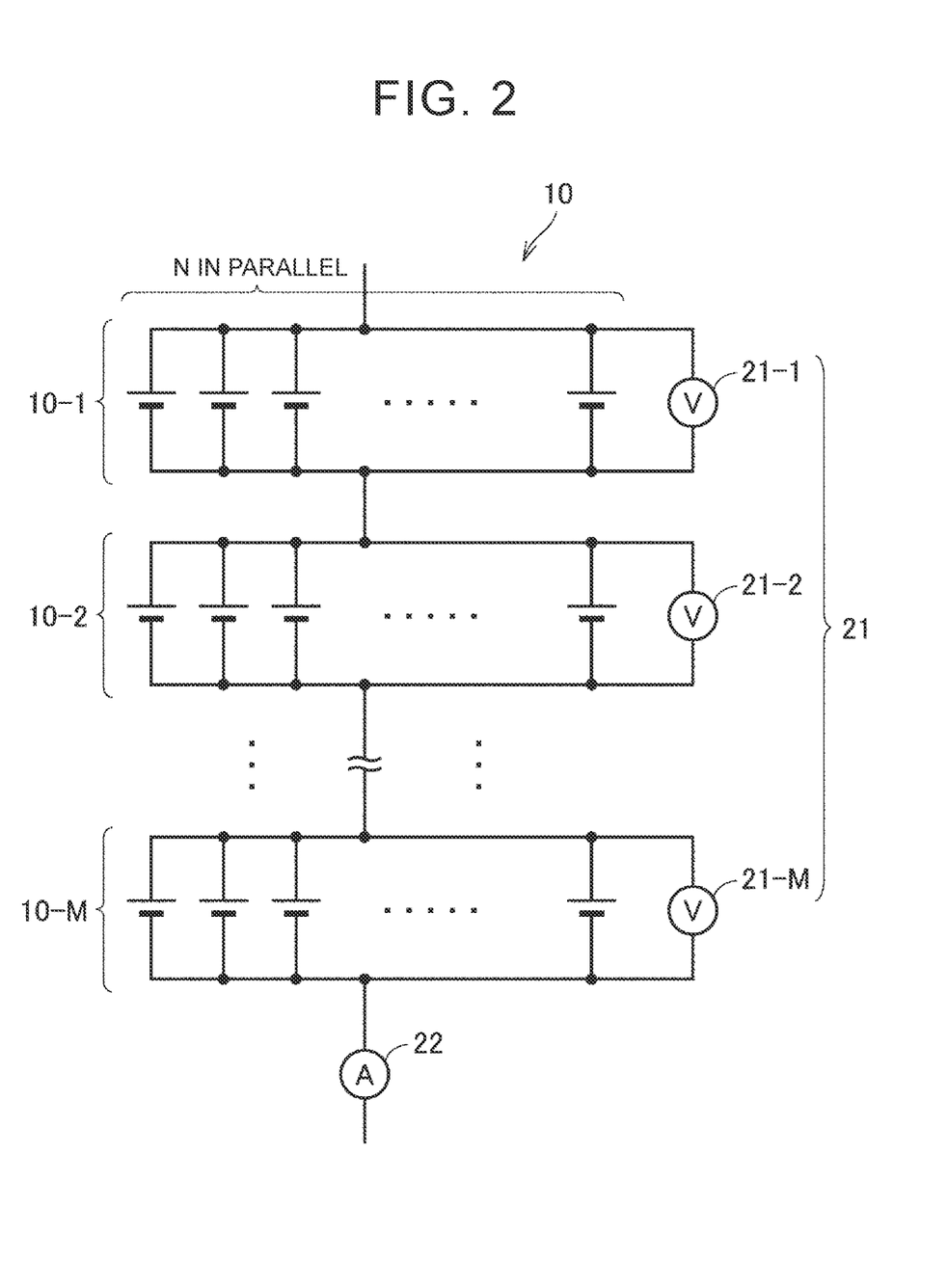
FIG. 2 is a view illustrating an example of a configuration of a battery pack illustrated in FIG. 1.

FIG. 2 is a view illustrating an example of a configuration of the battery pack 10 illustrated in FIG. 1. Referring to FIG. 2, in this battery pack 10, the plural cells are connected in parallel to constitute a block (or a module), and the plural blocks are connected in series to constitute the battery pack 10. More specifically, the battery pack 10 includes blocks 10-1 to 10-M that are connected in series, and each of the blocks 10-1 to 10-M includes N pieces of the cells that are connected in parallel.

A voltage sensor 21-1 detects a voltage of the block 10-1. More specifically, the voltage sensor 21-1 detects a voltage VB1 of the N pieces of the cells constituting the block 10-1. A voltage sensor 21-2 detects a voltage VB2 of the N pieces of the cells constituting the block 10-2. The same applies to a voltage sensor 21-M. The current sensor 22 detects the current IB flowing through each of the blocks 10-1 to 10-M. That is, the current sensor 22 detects a total current flowing through the N pieces of the cells in each of the blocks.

Figure 3:
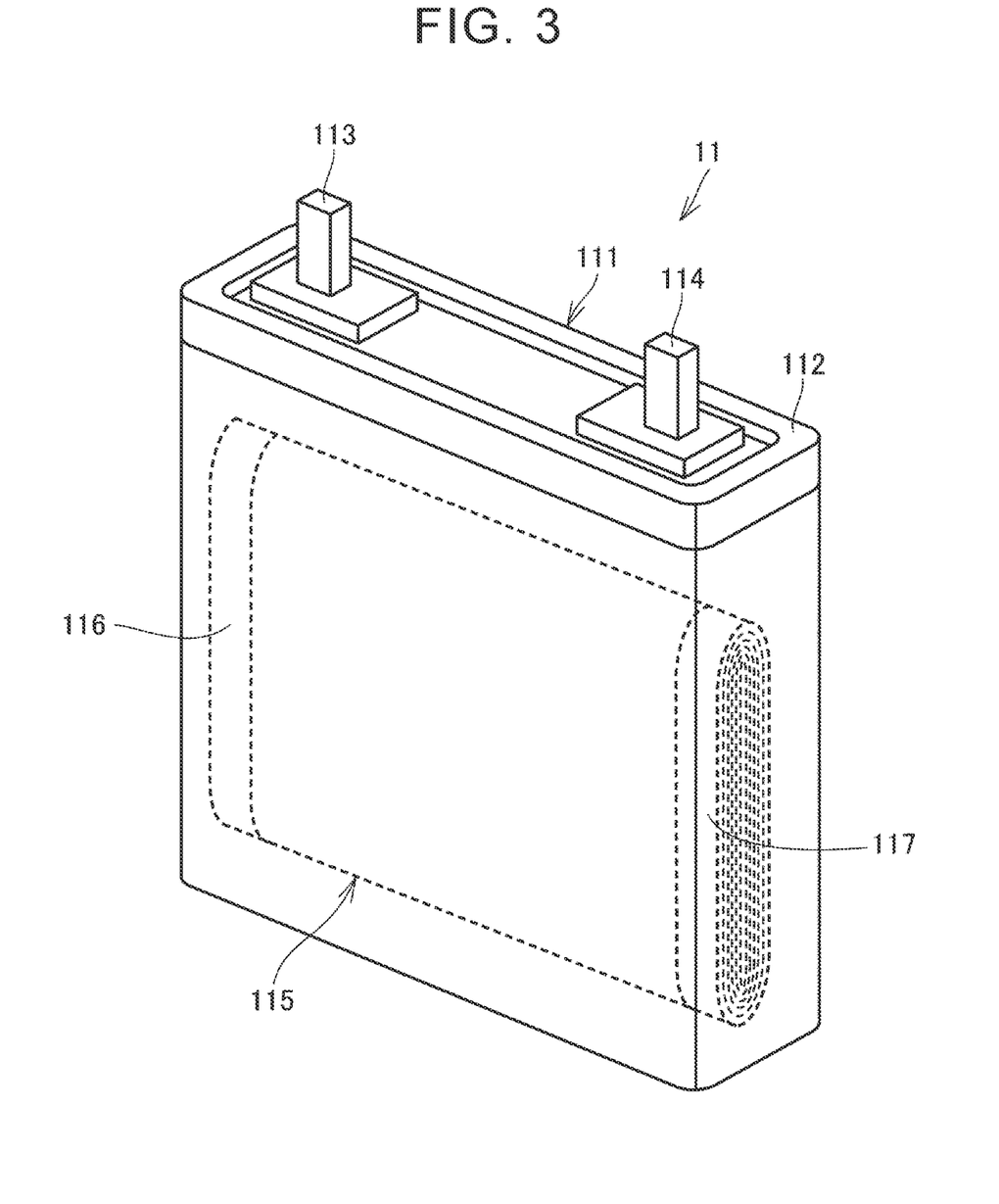
FIG. 3 is a view illustrating an example of a configuration of each cell.

FIG. 3 is a view illustrating a configuration of each of the cells. In FIG. 3, a part of the inside of the cell is illustrated in a see-through manner. Referring to FIG. 3, a cell 11 includes a casing 111, a positive-electrode external terminal 113, a negative-electrode external terminal 114, and an electrode body 115. The casing 111 has a square shape (a substantially rectangular parallelepiped shape), and an upper surface of the casing 111 is sealed by a lid body 112. The lid body 112 may include an electrolyte injection hole, a gas discharge valve, a current interrupt device (CID), and the like. The shape of the casing 111 is not limited to the square shape (the substantially rectangular parallelepiped shape), but may be a cylindrical shape or a laminate shape.

The positive-electrode external terminal 113 and the negative-electrode external terminal 114 are provided on an upper surface of the lid body 112. In the casing 111, the positive-electrode external terminal 113 and the negative-electrode external terminal 114 are respectively connected to a positive-electrode collector terminal and a negative-electrode collector terminal (neither of which is illustrated).

The electrode body 115 is formed of a positive electrode sheet, a negative electrode sheet, and a separator. The electrode body 115 may have a rolled shape as illustrated, or may have a stack shape. The electrode body 115 includes a positive electrode section 116 and a negative electrode section 117. The positive electrode section 116 is formed by an uncoated portion of the positive electrode sheet. The negative electrode section 117 is formed by an uncoated portion of the negative electrode sheet. The positive electrode section 116 is connected to the positive-electrode external terminal 113 through the positive-electrode collector terminal, which is not illustrated. The negative electrode section 117 is connected to the negative-electrode external terminal 114 through the negative-electrode collector terminal, which is not illustrated.

Configurations and materials that are conventionally known as of a positive electrode sheet, a separator, and an electrolyte solution of the lithium-ion secondary battery can be used for the positive electrode sheet, the separator, and an electrolyte solution of the electrode body 115, respectively. As an example, a ternary material in which a lithium cobalt oxide is partially replaced with nickel and manganese can be used for the positive electrode sheet. Polyolefin (for example, polyethylene or polypropylene) can be used for the separator. The electrolyte solution contains an organic solvent (for example, a mixed solvent of dimethyl carbonate (DMC), ethyl methyl carbonate (EMC), and ethylene carbonate (EC)), lithium salt (for example, $LiPF_6$), and an additive (for example, lithium bis(oxalato)borate (LiBOB) or $Li[PF_2(C_2O_4)_2]$). Instead of the electrolyte solution, a polymer-based electrolyte may be used, or an inorganic solid electrolyte such as of oxide-based or sulfide-based may be used.

Conventionally, a carbon material (for example, graphite) is adopted as a typical negative-electrode active material of the lithium-ion secondary battery. Meanwhile, in this first embodiment, a mixed material produced by mixing a silicon-based material (Si or SiO) into the carbon material is adopted as an active material of the negative electrode sheet. When the silicon-based material is mixed, energy density of the battery pack 10 is increased, which can increase full-charge capacity thereof. However, only the silicon-based material may be adopted as the negative-electrode active material.

When the silicon-based material is used for the negative-electrode active material, the full-charge capacity can be increased. However, meanwhile, the hysteresis prominently appears on the SOC-OCV curve. It is considered that generation of such hysteresis is caused by a volume change of the negative-electrode active material associated with charging/discharging.

Hysteresis on SOC-OCV Curve

Figure 4:
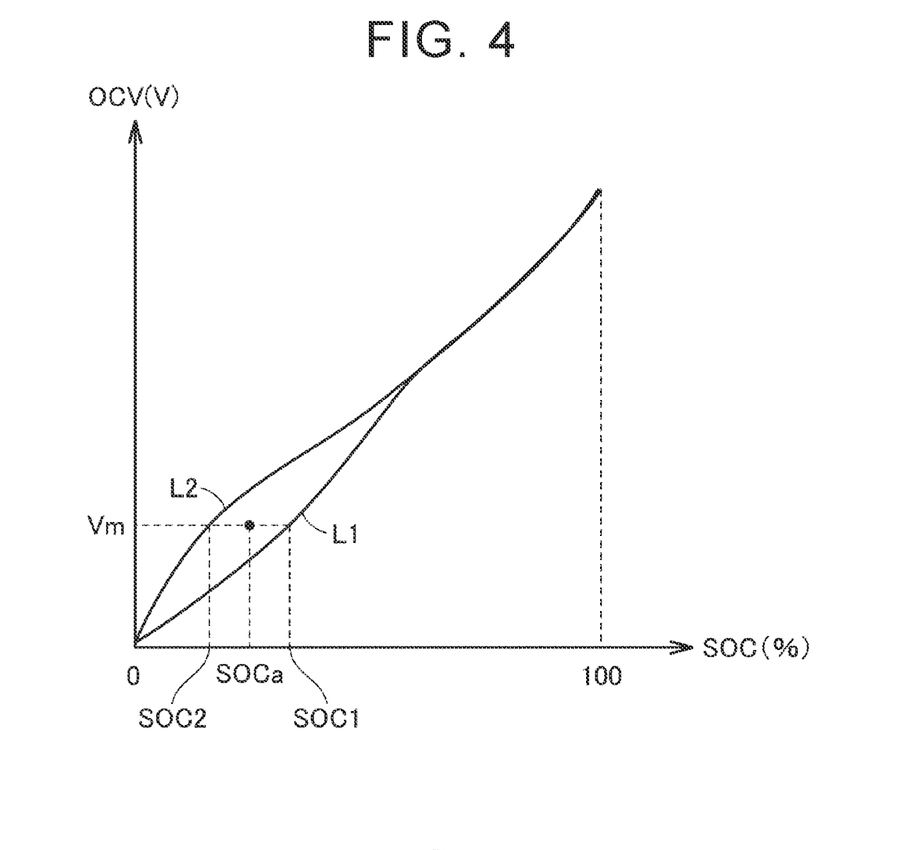
FIG. 4 is a graph illustrating an example of a SOC-OCV curve of the cell that constitutes the battery pack.

FIG. 4 is a graph illustrating an example of the SOC-OCV curve of the cell that constitutes the battery pack 10. In FIG. 4, a vertical axis represents an OCV (V), and a horizontal axis represents the SOC (%) of the cell.

Referring to FIG. 4, a curve line L1 indicates an example of the SOC-OCV curve in the case where the cell is discharged. This curve line L1 is acquired by repeating discharging and a pause (a stop of discharging) after the cell is brought into a full-charge state. A curve line L2 indicates an example of the SOC-OCV curve in the case where the cell is charged. This curve line L2 is acquired by repeating charging and a pause (a stop of charging) after the cell is brought into a full-discharge state. Hereinafter, the curve line L1 will be referred to as a "discharging curve L1" and the curve line L2 will be referred to as a "charging curve L2".

Figure 5:
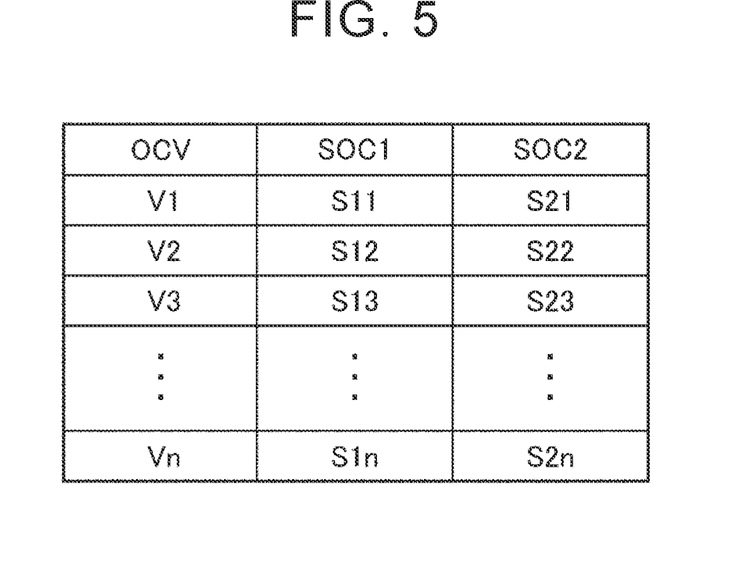
FIG. 5 is a table illustrating an example of the map of a discharging curve and a charging curve.

The discharging curve L1 and the charging curve L2 just as described are acquired in advance by a previous evaluation experiment or the like, and are stored as the map in the memory 104 of the ECU 100. FIG. 5 is a table illustrating an example of the map of the discharging curve L1 and the charging curve L2. Referring to FIG. 5, a SOC 1 represents the SOC on the discharging curve L1, and a SOC 2 represents the SOC on the charging curve L2. Relationships between the OCV and each of the SOC 1 and the SOC 2 in the full-discharge state and the full-charge state of the cell are acquired in advance by the previous evaluation experiment or the like, and are stored as the map as illustrated in FIG. 5 in the memory 104.

Referring back to FIG. 4, the OCV on the discharging curve L1 is lower than the OCV on the charging curve L2 at a certain SOC. Such a tendency is prominent in a region where the SOC is low (for example, a region where the SOC is lower than 40 to 50%). In the case where only the silicon-based material is used for the negative-electrode active material instead of the mixed material of the carbon material and the silicon-based material, the OCV on the discharging curve L1 becomes lower than the OCV on the charging curve L2 also in a region where the SOC is high.

The OCV on the discharging curve L1 represents a minimum value of the OCV at each of the SOCs, and the OCV on the charging curve L2 represents a maximum value of the OCV at each of the SOCs. The state of the cell can be any state in a region surrounded by the discharging curve L1 and the charging curve L2 (including any state on the discharging curve L1 and the charging curve L2). A divergence between the OCV on the discharging curve L1 and the OCV on the charging curve L2 indicates existence of the hysteresis in the cell.

In other words, for example, when the OCV is Vm, the SOC can exist within a range from the SOC 2, which represents the SOC on the charging curve L2, and the SOC1, which represents the SOC on the discharging curve L1. Thus, in the case where the SOC during the last stop of the system (a last SOC value) falls within the above range when the SOC is estimated from the OCV at the time of activating the system, a change (the divergence) of the SOC from the last SOC value is possibly caused by the influence of the hysteresis. Accordingly, in the battery system 2 according to this first embodiment, in the case where the SOC during the stop of the system (the last SOC value) is equal to or lower than the SOC 1 and is equal to or higher than the SOC 2, the last SOC value is adopted as the initial SOC value at the time of activating the system without adopting the SOC (a current SOC value) that is estimated from the OCV at the time of activating the system.

Meanwhile, in the case where the SOC during the last stop of the system (the last SOC value) falls out of the above range when the SOC is estimated from the OCV at the time of activating the system, it can be said that the change (the divergence) of the SOC from the last SOC value is not caused by the influence of the hysteresis. Accordingly, in the battery system 2 according to this first embodiment, in the case where the SOC during the stop of the system (the last SOC value) is higher than the SOC 1 or where the last SOC value is lower than the SOC 2, the SOC (the current SOC value) that is estimated from the OCV at the time of activating the system is set as the initial SOC value at the time of activating the system. In this way, it is possible to improve SOC estimation accuracy of the secondary battery having the hysteresis on the SOC-OCV curve.

In this first embodiment, the SOC during actuation of the system is calculated by adding the integrated value of the charge/discharge current to the initial SOC value, which is set at the time of activating the system. In the above, the last SOC value is a calculated value of the SOC during the stop of the system in the vehicle 1. In addition, in this first embodiment, the current SOC value that is estimated from the OCV at the time of activating the system is set to a central value (an average value) between the SOC estimated from the discharging curve L1 and the SOC estimated from the charging curve L2. The method for calculating the current SOC value is not limited thereto. A value between the SOC 1 and the SOC 2 can appropriately be calculated as the current SOC value by using the SOC 1 estimated from the discharging curve L1 and the SOC 2 estimated from the charging curve L2.

Figure 6:
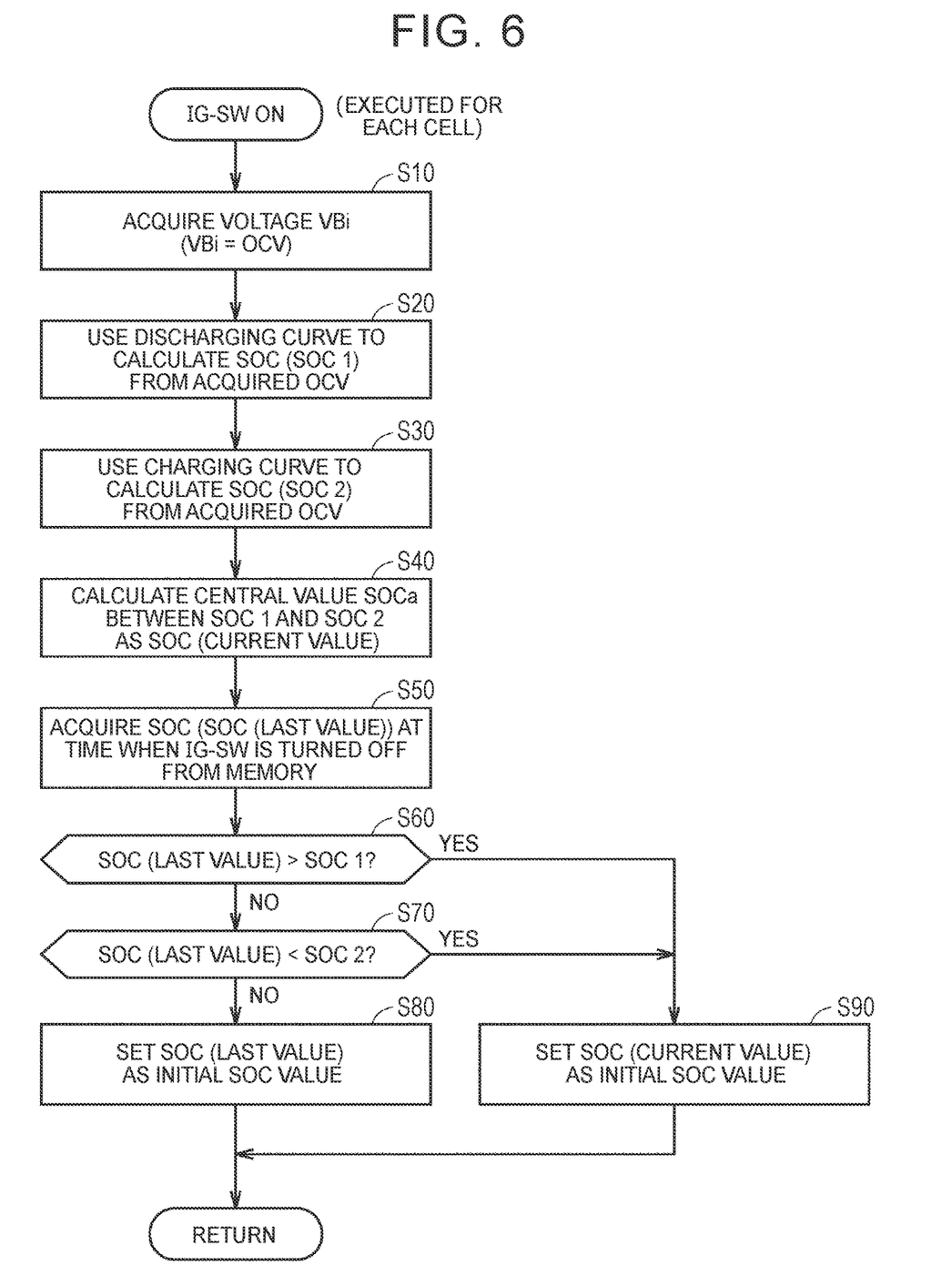
FIG. 6 is a flowchart illustrating an example of a procedure of initial SOC value setting processing that is executed by an ECU at the time of activating a system of the vehicle.

FIG. 6 is a flowchart illustrating an example of a procedure of initial SOC value setting processing that is executed by the ECU 100 at the time of activating the system of the vehicle 1. The processing illustrated in this flowchart is executed for each of the cells, and is initiated when the driver turns the IG-SW 80 on, for example.

Referring to FIG. 6, when the IG-SW 80 is turned on, the ECU 100 acquires the voltage VBi of the target cell from the voltage sensor 21 (step S10). The battery pack 10 is not charged/discharged immediately after the IG-SW 80 is turned on. Thus, the voltage VBi acquired at this time point can correspond to the OCV.

Next, the ECU 100 uses the map (FIG. 5) of the discharging curve L1 (FIG. 4) to calculate the SOC (the SOC 1) from the OCV that is acquired in step S10 (step S20). Furthermore, the ECU 100 uses the map (FIG. 5) of the charging curve L2 (FIG. 4) to calculate the SOC (the SOC 2) from the OCV that is acquired in step S10 (step S30).

Then, the ECU 100 calculates a central value (an average value) SOCa between the SOC (the SOC 1) calculated in step S20 and the SOC (the SOC 2) calculated in step S30 as the SOC (the current value) of the target cell (step S40).

Next, the ECU 100 acquires the SOC of the target cell, which is stored in the memory 104 during the last stop of the system in the vehicle 1, that is, when the IG-SW 80 is turned off, as the SOC (the last value) from the memory 104 (step S50). Then, the ECU 100 determines whether the acquired SOC (the last value) is higher than the SOC 1 calculated in step S20 (step S60).

If it is determined that the SOC (the last value) is determined to be higher than the SOC 1 (YES in step S60), it is considered that the change of the SOC from the SOC (the last value) is not caused by the influence of the hysteresis. Thus, the ECU 100 sets the SOC (the current value) calculated in step S40 as the initial SOC value at the time of activating the system (step S90).

If it is determined in step S60 that the SOC (the last value) is equal to or lower than the SOC 1 (NO in step S60), the ECU 100 determines whether the SOC (the last value) acquired in step S50 is lower than the SOC 2 calculated in step S30 (step S70).

If it is determined that the SOC (the last value) is lower than the SOC 2 (YES in step S70), it is considered that the change of the SOC from the SOC (the last value) is not caused by the influence of the hysteresis. Thus, the processing proceeds to step S90. That is, the SOC (the current value) calculated in step S40 is set as the initial SOC value at the time of activating the system.

If it is determined in step S70 that the SOC (the last value) is equal to or higher than the SOC 2 (NO in step S70), the change of the SOC from the SOC (the last value) is possibly caused by the influence of the hysteresis. Thus, the ECU 100 sets the SOC (the last value) acquired in step S50 as the initial SOC value at the time of activating the system (step S80).

As it has been described so far, according to this first embodiment, it is possible to improve setting accuracy of the initial SOC value at the time of activating the system in the vehicle 1 by considering the hysteresis on the SOC-OCV curve. As a result, the SOC estimation accuracy can be improved.

Second Embodiment

In each of the cells, polarization occurs due to a difference in salt concentration between the active material and the electrolyte solution in conjunction with charging/discharging. When the polarization occurs, a polarization voltage is generated between the terminals of the cell, which degrades detection accuracy of the OCV. The polarization by this difference in the salt concentration is alleviated with a lapse of time and thus differs from the hysteresis on the SOC-OCV curve. In a state where the polarization occurs by the difference in the salt concentration, it is difficult to detect the accurate OCV, and thus the SOC estimation accuracy using the SOC-OCV curve is possibly degraded.

Accordingly, in this second embodiment, in the initial SOC value setting processing executed at the time of activating the system in the vehicle 1, it is determined whether the polarization is eliminated in a system stop period (an off-period of the IG-SW 80). Then, in the case where the polarization is eliminated, the initial SOC value setting processing described in the first embodiment is executed. On the other hand, in the case where the polarization is not eliminated at the time of activating the system, the SOC is not estimated using the SOC-OCV curve, and the SOC (the last SOC value) during the stop of the system is used as the initial SOC value.

In order to determine whether the polarization is eliminated in the system stop period, in this second embodiment, the system stop period is measured. The system stop period is measured by actuating a timer during the system stop period. Thus, in this second embodiment, even in the system stop period, the electricity is supplied to the ECU 100 or at least to the timer (not illustrated) from the auxiliary battery 70.

A time required to eliminate the polarization (a polarization elimination time) is extended as the temperature of the cell is lowered. Thus, in this second embodiment, a relationship between the polarization elimination time and the temperature of the cell is acquired in advance by a previous evaluation experiment or the like, and is stored as a map in the memory 104 of the ECU 100. In this way, it is possible to accurately determine whether the polarization is eliminated at the time of activating the system.

Figure 7:
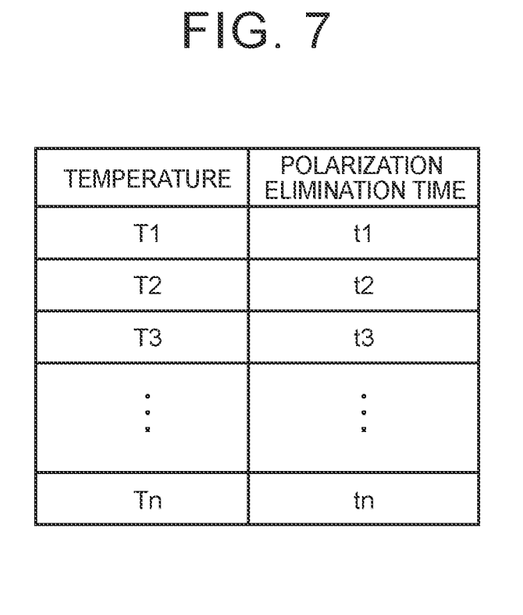
FIG. 7 is a table illustrating an example of a polarization elimination time map.

FIG. 7 is a table illustrating an example of a polarization elimination time map. Referring to FIG. 7, the relationship between the temperature of the cell and the polarization elimination time is acquired in advance by the previous evaluation experiment or the like, and is stored as the map as illustrated in FIG. 7 in the memory 104. As the temperature of the cell is lowered, the polarization elimination time is set to a longer value. For example, in the case where a relationship of $T1<T2<\ldots<Tn$ is applied to the temperature of the cell, the polarization elimination time has a relationship of $t1>t2>\ldots>tn$.

Figure 8:
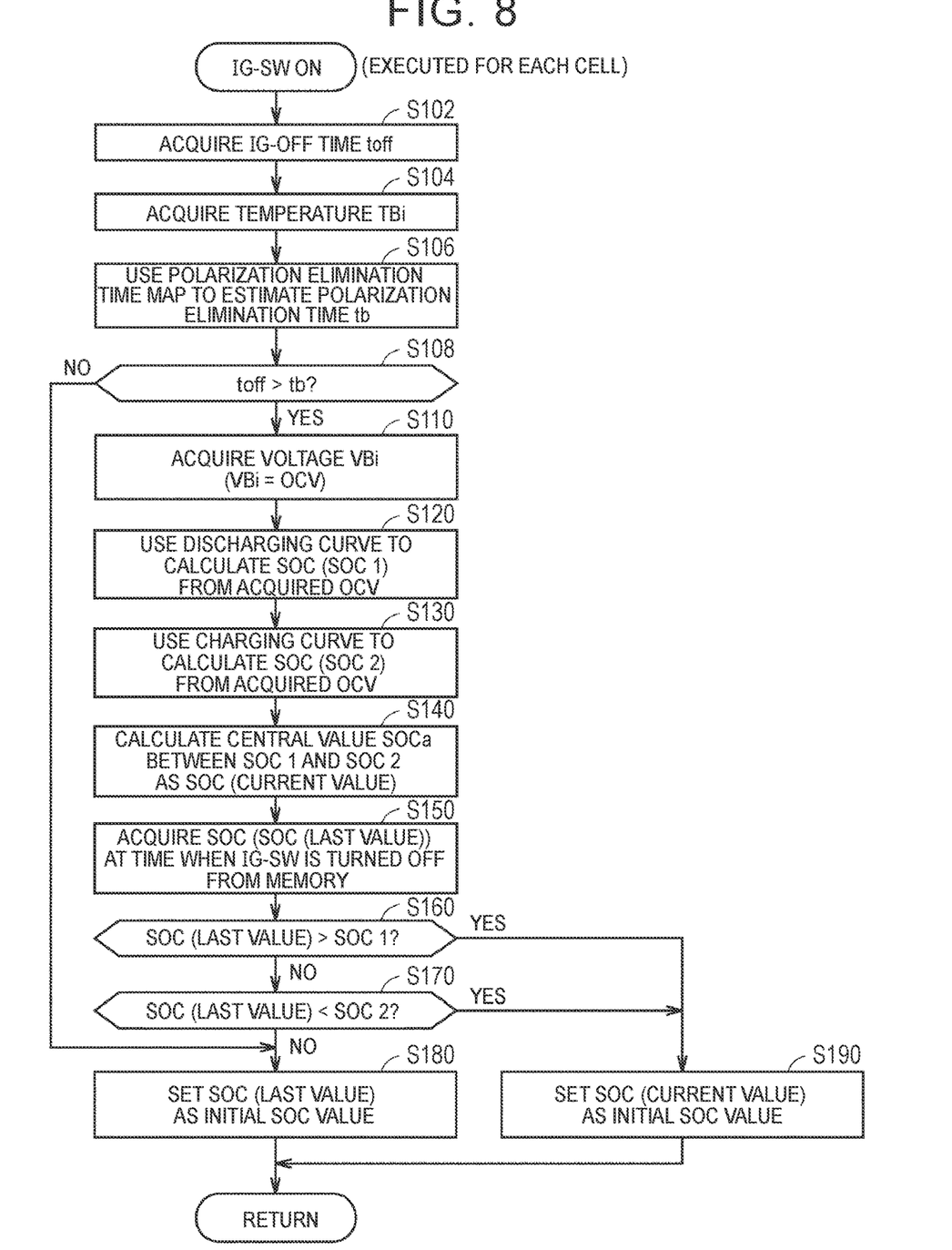
FIG. 8 is a flowchart illustrating an example of a procedure of initial SOC value setting processing that is executed by the ECU at the time of activating the system of the vehicle in a second embodiment.

An overall configuration of a vehicle in the second embodiment is the same as that of the vehicle 1 illustrated in FIG. 1. FIG. 8 is a flowchart illustrating an example of a procedure of initial SOC value setting processing that is executed by the ECU 100 at the time of activating the system of the vehicle 1 in the second embodiment. The processing illustrated in this flowchart is also executed for each of the cells, and is initiated when the driver turns the IG-SW 80 on, for example.

Referring to FIG. 8, processing in steps S110 to S190 is the same as the processing in steps S10 to S90 illustrated in FIG. 6. In this flowchart, processing in steps S102 to S108 is executed before step S110.

That is, when the IG-SW 80 is turned on, the ECU 100 acquires an IG-off time toff (the system stop period) that indicates an elapsed time since the last time the IG-SW 80 is turned off (step S102). The ECU 100 also acquires the temperature TBi of the target cell from the temperature sensor 23 (step S104).

Next, the ECU 100 reads the polarization elimination time map (FIG. 7), which indicates the relationship between the temperature of the cell and the polarization elimination time, from the memory 104, and uses the polarization elimination time map to estimate a polarization elimination time tb from the temperature TBi acquired in step S104 (step S106).

Then, the ECU 100 determines whether the IG-off time toff is longer than the polarization elimination time tb estimated in step S106 (step S108). If the IG-off time toff is longer than the polarization elimination time tb (YES in step S108), it is determined that the polarization is eliminated, and the processing proceeds to step S110. The processing in step S110 onward is as described with reference to FIG. 6.

If it is determined in step S108 that the IG-off time toff is equal to or shorter than the polarization elimination time tb (NO in step S108), it is determined that the polarization is not eliminated, and the processing proceeds to step S180. That is, in this case, the accurate OCV cannot be detected, and the SOC estimation accuracy using the SOC-OCV curve is degraded. Thus, the SOC (the last value) that is stored in the memory 104 during the last stop of the system in the vehicle 1, that is, when the IG-SW 80 is turned off, is set as the initial SOC value at the time of activating the system.

As it has been described so far, according to this second embodiment, it is possible to improve the setting accuracy of the initial SOC value at the time of activating the system in the vehicle 1 by also considering an influence of the polarization. As a result, the SOC estimation accuracy can be improved.

Modified Embodiment

In the above second embodiment, the system stop period of the vehicle 1 is measured. Thus, even during the system stop period, the electricity is supplied to the ECU 100 or at least to the timer (not illustrated) from the auxiliary battery 70. However, there is a case where a user disconnects the auxiliary battery 70 (for example, a power cable is disconnected from a terminal of the auxiliary battery 70) in the system stop period. The disconnection of the auxiliary battery 70 during the system stop period will hereinafter be referred to as that the "disconnection of the auxiliary battery" occurs.

In this modified embodiment, in the case where the disconnection of the auxiliary battery occurs, the system stop period (the off-period of the IG-SW 80) is not measured. Thus, it is not determined whether the polarization is eliminated during the system stop period. On the other hand, in the case where the disconnection of the auxiliary battery occurs does not occur, similar to the second embodiment, the system stop period is measured, and it is determined whether the polarization is eliminated at the time of activating the system.

Presence or absence of the disconnection of the auxiliary battery can be determined, for example, by determining whether data in static random access memory (SRAM) that constitutes the memory 104 is normal at the time of activating the system. That is, in the case where the data in the SRAM is normal at the time of activating the system, it can be determined that the disconnection of the auxiliary battery does not occur. On the other hand, in the case where the data in the SRAM is abnormal (for example, the data does not exist) at the time of activating the system, it can be determined that the disconnection of the auxiliary battery occurs.

Figure 9:
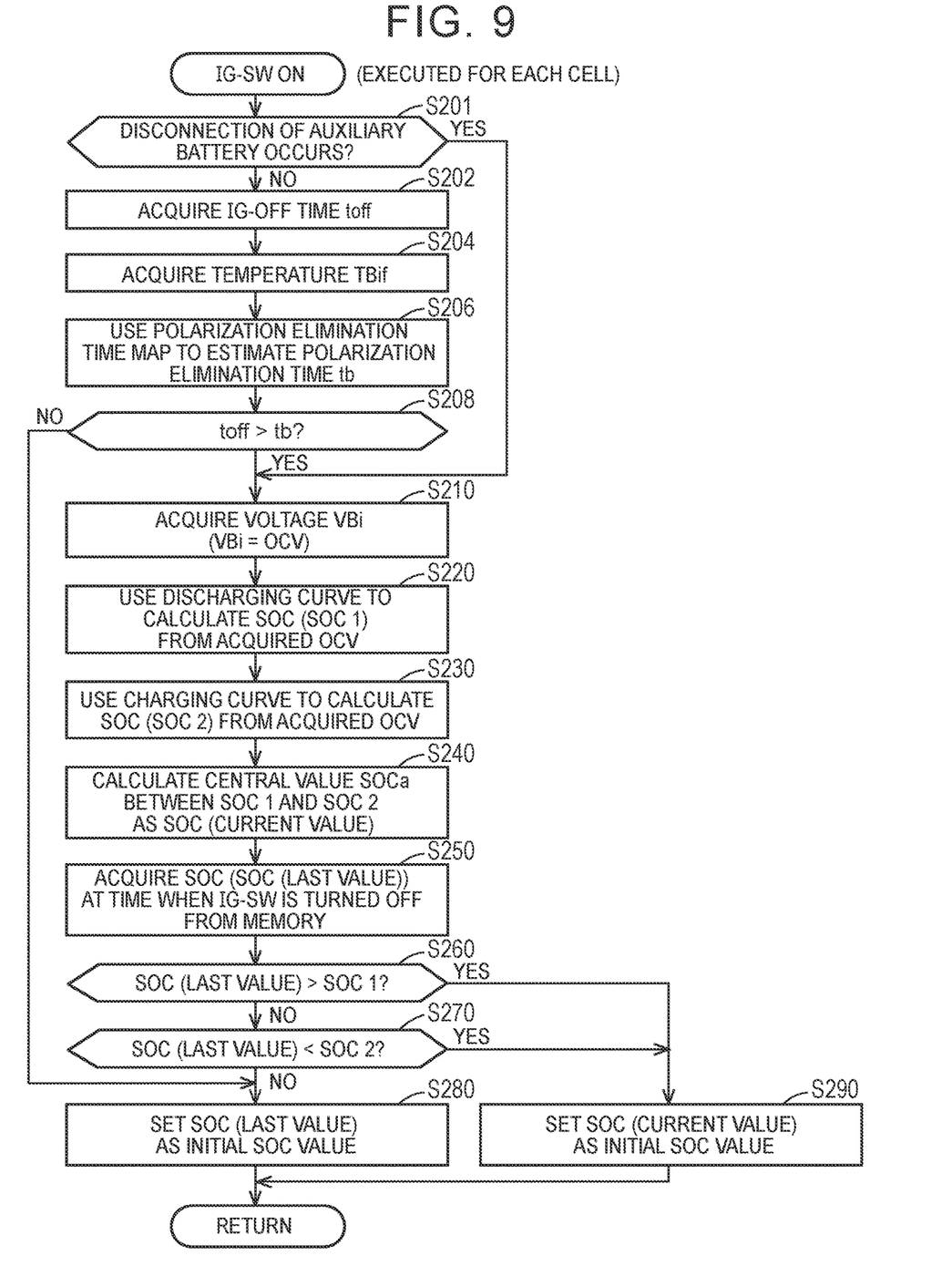
FIG. 9 is a flowchart illustrating an example of a procedure of initial SOC value setting processing that is executed by the ECU at the time of activating the system of the vehicle in a modified embodiment.

FIG. 9 is a flowchart illustrating an example of a procedure of initial SOC value setting processing that is executed by the ECU 100 at the time of activating the system of the vehicle 1 in this modified embodiment. The processing illustrated in this flowchart is also executed for each of the cells, and is initiated when the driver turns the IG-SW 80 on, for example.

Referring to FIG. 9, processing in steps S202 to S290 is the same as the processing in steps S102 to S190 illustrated in FIG. 8. In this flowchart, processing in step S201 is executed before step S202.

That is, when the IG-SW 80 is turned on, the ECU 100 determines whether the disconnection of the auxiliary battery occurs during the system stop period (step S201). If it is determined that the disconnection of the auxiliary battery does not occur (NO in step S201), the processing proceeds to step S202, and the IG-off time toff (the system stop period) that indicates the elapsed time since the last time the IG-SW 80 is turned off is acquired.

On the other hand, if it is determined in step S201 that the disconnection of the auxiliary battery occurs during the system stop period (YES in step S201), the ECU 100 does not execute the processing in steps S202 to S208, and the processing proceeds to step S210. The processing in step S210 onward is as described with reference to FIG. 6.

Note that, if the disconnection of the auxiliary battery occurs during the system stop period (YES in step S201), it cannot be determined whether the polarization is eliminated. Thus, the processing may proceed to step S280. That is, in this case, the polarization is not possibly eliminated. The accurate OCV cannot be detected in the case where the polarization is not eliminated. As a result, the SOC estimation accuracy using the SOC-OCV curve is degraded. Then, the processing proceeds to step S280, and the SOC (the last value), which is stored in the memory 104 during the last stop of the system in the vehicle 1, that is, when the IG-SW 80 is turned off, is set as the initial SOC value at the time of activating the system.

As it has been described so far, according to this modified embodiment, it is possible to improve the setting accuracy of the initial SOC value at the time of activating the system in the vehicle 1 by further considering the presence or the absence of the disconnection of the auxiliary battery during the system stop period. As a result, the SOC estimation accuracy can be improved.

In each of the above-described embodiments, the initial SOC value setting processing is executed for each of the cells. However, the initial SOC value setting processing may be executed for the OCV and the SOC of the entire battery pack 10.

It should be understood that the embodiments disclosed herein are illustrative in all respects and are not restrictive. The scope of the disclosure is defined by the claims rather than the description of the above embodiments, and intends to include all modifications falling within the claims and equivalents thereof

What is claimed is:

1. A battery system comprising:
   a secondary battery; and
   a controller configured to estimate a SOC of the secondary battery from an OCV of the secondary battery by using a discharging curve line and a charging curve line, the discharging curve line representing a SOC-OCV characteristic of the secondary battery when the secondary battery is discharged, and the charging curve line representing the SOC-OCV characteristic of the secondary battery when the secondary battery is charged, wherein
   the controller is configured to execute setting processing for setting an initial value of the SOC at next time of activating a system in a vehicle after a stop of the system, and
   the setting processing includes:
      first processing to set the SOC estimated from the OCV at the time of activating the system as the initial value in the case where the SOC during the stop of the system is higher than a first SOC, which represents the SOC estimated from the OCV at the time of activating the system by using the discharging curve line, or the SOC during the stop of the system is lower than a second SOC, which represents the SOC estimated from the OCV at the time of activating the system by using the charging curve line; and
      second processing to set the SOC during the stop of the system as the initial value in the case where the SOC during the stop of the system is equal to or lower than the first SOC and is equal to or higher than the second SOC.

2. The battery system according to claim 1, wherein
   the controller is configured to:
      execute the setting processing in the case where polarization of the secondary battery is eliminated at the time of activating the system; and
      set the SOC during the stop of the system as the initial value in the case where the polarization of the secondary battery is not eliminated at the time of activating the system.

3. The battery system according to claim 2, wherein
   the controller is configured to determine that the polarization is eliminated in the case where a time during the stop of the system passes a polarization elimination time indicating a time in which the polarization of the secondary battery is eliminated, and
   the polarization elimination time is set to be extended as a temperature of the secondary battery is lowered.

4. A SOC estimation method for a secondary battery in a battery system,
   the battery system including:
   the secondary battery; and
   a controller configured to estimate a SOC of the secondary battery from an OCV of the secondary battery by using a discharging curve line and a charging curve line, the discharging curve line representing a SOC-OCV characteristic of the secondary battery when the secondary battery is discharged, and the charging curve line representing the SOC-OCV characteristic of the secondary battery when the secondary battery is charged, the SOC estimation method comprising:
   a step of setting an initial value of the SOC at next time of activating a system in a vehicle after a stop of the vehicle, wherein
   the step of setting includes:
      a step of setting the SOC estimated from the OCV at the time of activating the system as the initial value in the case where the SOC during the stop of the system is higher than a first SOC, which represents the SOC estimated from the OCV at the time of activating the system by using the discharging curve line, or the SOC during the stop of the system is lower than a second SOC, which represents the SOC estimated from the OCV at the time of activating the system by using the charging curve line; and
      a step of setting the SOC during the stop of the system as the initial value in the case where the SOC during the stop of the system is equal to or lower than the first SOC and is equal to or higher than the second SOC.

* * * * *